(12) United States Patent
Haratani (10) Patent No.: US 7,460,393 B2
(45) Date of Patent: *Dec. 2, 2008

(54) MAGNETIC STORAGE DEVICE

(75) Inventor: Susumu Haratani, Tokyo (JP)

(73) Assignee: TDK Corporation, Tokyo (JP)

( * ) Notice: Subject to any disclaimer, the term of this patent is extended or adjusted under 35 U.S.C. 154(b) by 501 days.

This patent is subject to a terminal disclaimer.

(21) Appl. No.: 11/233,140

(22) Filed: Sep. 23, 2005

(65) Prior Publication Data

US 2006/0067008 A1  Mar. 30, 2006

(30) Foreign Application Priority Data

Sep. 28, 2004  (JP)  ............... 2004-282566

(51) Int. Cl.
*G11C 11/00* (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 5,587,943 A | 12/1996 | Torok et al. | |
| 7,002,840 B2 * | 2/2006 | Kamijima et al. | ........... 365/173 |
| 7,020,015 B1 * | 3/2006 | Hong et al. | .................. 365/171 |
| 7,227,771 B2 * | 6/2007 | Ezaki et al. | ................. 365/158 |
| 2006/0067007 A1 * | 3/2006 | Haratani | ..................... 360/321 |
| 2006/0279980 A1 * | 12/2006 | Haratani et al. | ............. 365/158 |

FOREIGN PATENT DOCUMENTS

| | | |
|---|---|---|
| JP | A-2000-090658 | 3/2000 |
| JP | B2-3466470 | 8/2003 |
| JP | A-2004-128430 | 4/2004 |

* cited by examiner

*Primary Examiner*—Gene N. Auduong
(74) *Attorney, Agent, or Firm*—Oliff & Berridge, PLC (57) ABSTRACT

A magnetic storage device includes a magnetic yoke. A maximum thickness of each open end of the magnetic yoke in a diameter direction of the magnetic yoke is set to be larger than a maximum thickness of a second magnetic layer of a magnetoresistive element in the diameter direction of the magnetic yoke, thereby materializing the shape of the magnetic yoke. Moreover, a magnetic field generated from the magnetic yoke can be increased by optimization of the shape of the magnetic yoke, thereby reducing writing current.

8 Claims, 10 Drawing Sheets

MAGNETIC STORAGE DEVICE

BACKGROUND OF THE INVENTION

1. Field of the Invention

The present invention relates to a magnetic storage device that can store information therein by using a magnetoresistive effect.

2. Description of the Related Art

Conventionally, a magnetic storage device called as a magnetic random access memory (MRAM) that can store information therein by using a magnetoresistive effect is widely known as a nonvolatile memory device that can operate at high speeds.

The magnetic storage device is required to efficiently perform writing to a magnetoresistive element in order to achieve improvement of an operation speed, reduction of writing current, and the like. For example, a magnetic storage device is proposed that includes an approximately annular magnetic yoke for concentrating a magnetic flux generated around a wiring on a magnetoresistive element (see Japanese Patent Laid-Open Publications Nos. 2000-90658 and 2004-128430, for example).

The intensity of a magnetic field generated from the magnetic yoke is determined by its material, shape, and the like. However, there was conventionally almost no specific proposal regarding the shape of the magnetic yoke and a relationship between the intensity of the magnetic field generated from the magnetic yoke and the shape of the magnetic yoke was not made apparent.

SUMMARY OF THE INVENTION

In view of the foregoing problems, various exemplary embodiments of this invention provide a magnetic storage device that can materialize a shape of a magnetic yoke and can increase a magnetic field generated from the magnetic yoke by optimizing the shape of the magnetic yoke so as to reduce writing current.

As a result of diligent research, the inventor of the present invention found the magnetic storage device that could materialize the shape of the magnetic yoke and could increase the magnetic field generated from the magnetic yoke by optimizing the shape of the magnetic yoke so as to reduce the writing current.

(1) A magnetic storage device comprising a plurality of storage areas each of which comprises: a magnetoresistive element having a sensitive magnetic layer in which a magnetizing direction is changed by an external magnetic field; a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a maximum thickness of each of the open ends of the magnetic yoke in a diameter direction of the magnetic yoke is set to be larger than a maximum thickness of the sensitive magnetic layer of the magnetoresistive element in the diameter direction of the magnetic yoke.

(2) A magnetic storage device comprising a plurality of storage areas each of which comprises: a magnetoresistive element having a sensitive magnetic layer in which a magnetizing direction is changed by an external magnetic field; a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a product of a maximum thickness of each of the open ends of the magnetic yoke in a diameter direction of the magnetic yoke and saturated magnetization in the magnetic yoke is set to be larger than a product of a maximum thickness of the sensitive magnetic layer of the magnetoresistive element in the diameter direction of the magnetic yoke and saturated magnetization in the sensitive magnetic layer.

(3) A magnetic storage device comprising a plurality of storage areas each of which comprises: a magnetoresistive element having a sensitive magnetic layer in which a magnetizing direction is changed by an external magnetic field; a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a width of each of the open ends of the magnetic yoke in an axial direction of the magnetic yoke is set to be equal to or larger than a width of the sensitive magnetic layer of the magnetoresistive element in the axial direction of the magnetic yoke and is set to be three times or less a length of the gap of the magnetic yoke in a circumferential direction of the magnetic yoke.

(4) A magnetic storage device comprising a plurality of storage areas each of which comprises: a magnetoresistive element having a sensitive magnetic layer in which a magnetizing direction is changed by an external magnetic field; a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a length of the gap of the magnetic yoke in a circumferential direction of the magnetic yoke is set to be equal to or larger than a length of the sensitive magnetic layer of the magnetoresistive element in the circumferential direction of the magnetic yoke and is set to be equal to or smaller than 1 µm.

(5) The magnetic storage device according to any one of (1) to (4), wherein the magnetoresistive element is arranged in such a manner that a pair of side faces thereof are at least partially opposed to end faces of the open ends of the magnetic yoke, respectively, and at least a part of the pair of side faces of the magnetoresistive element and the end faces of the open ends of the magnetic yoke have predetermined angles, respectively.

According to the magnetic storage device of the present invention, the shape of the magnetic yoke can be materialized. Moreover, the magnetic field generated from the magnetic yoke can be increased by optimization of the shape of the magnetic yoke, thereby reducing the writing current.

DETAILED DESCRIPTION OF THE PREFERRED EMBODIMENTS

According to an aspect of the present invention, a magnetic storage device a plurality of storage areas each of which includes: a magnetoresistive element having a sensitive magnetic layer in which a magnetizing direction is changed by an external magnetic field; a wiring that provides the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring. In the magnetic storage device, a maximum thickness of each of the open ends of the magnetic yoke in a diameter direction of the magnetic yoke is set to be larger than a maximum thickness of the sensitive magnetic layer of the magnetoresistive element in the diameter direction of the magnetic yoke. Due to this structure, the present invention can materialize a shape of the magnetic yoke, and can increase a magnetic field generated from the magnetic yoke by optimization of the shape of the magnetic yoke so as to reduce writing current.

According to another aspect of the present invention, a magnetic storage device includes a plurality of storage areas each of which includes: a magnetoresistive element having a sensitive magnetic layer in which a magnetizing direction is changed by an external magnetic field; a wiring that provides the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring. In the magnetic storage device, a product of a maximum thickness of each of the open ends of the magnetic yoke in a diameter direction of the magnetic yoke and saturated magnetization in the magnetic yoke is set to be larger than a product of a maximum thickness of the sensitive magnetic layer of the magnetoresistive element in the diameter direction of the magnetic yoke and saturated magnetization in the sensitive magnetic layer. Due to this, the present invention can overcome the above problem.

According to still another aspect of the present invention, a magnetic storage device includes a plurality of storage areas each of which includes: a magnetoresistive element having a sensitive magnetic layer in which a magnetizing direction is changed by an external magnetic field; a wiring that provides the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring. In the magnetic storage device, a width of each of the open ends of the magnetic yoke in an axial direction of the magnetic yoke is set to be equal to or larger than a width of the sensitive magnetic layer of the magnetoresistive element in the axial direction of the magnetic yoke and is set to be three times or less a length of the gap of the magnetic yoke in a circumferential direction of the magnetic yoke. Due to this, the present invention can overcome the above problem.

According to still another aspect of the present invention, a magnetic storage device includes a plurality of storage areas each of which includes: a magnetoresistive element having a sensitive magnetic layer in which a magnetizing direction is changed by an external magnetic field; a wiring that provides the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring. In the magnetic storage device, a length of the gap of the magnetic yoke in a circumferential direction of the magnetic yoke is set to be equal to or larger than a length of the sensitive magnetic layer of the magnetoresistive element in the circumferential direction of the magnetic yoke and is set to be equal to or smaller than 1 µm. Due to this, the present invention can overcome the above object.

A magnetic storage device according to a first exemplary embodiment of the present invention is now described in detail, with reference to the drawings.

First Exemplary Embodiment

Figure 1:
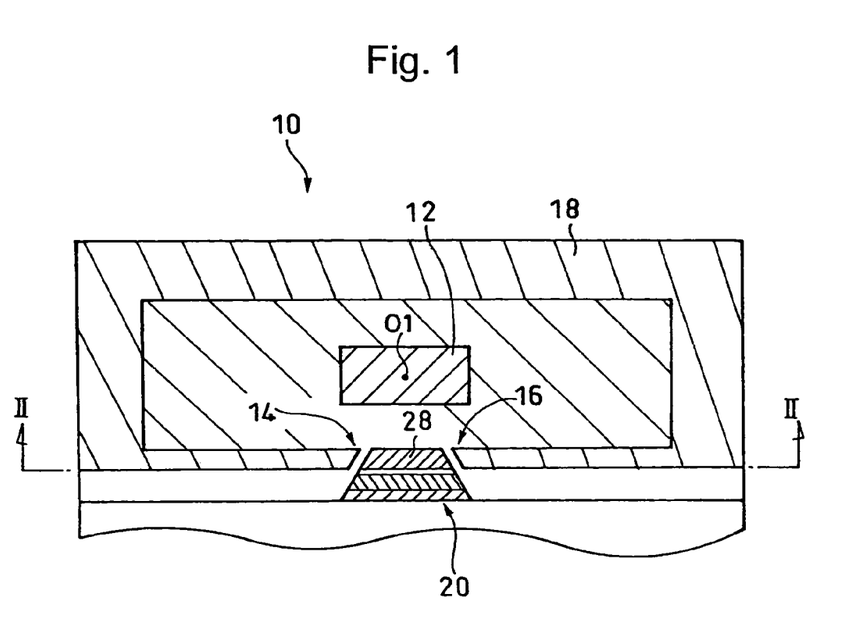
FIG. 1 is a schematic sectional side view showing a magnetic storage device according to a first exemplary embodiment of the present invention.
Figure 2:
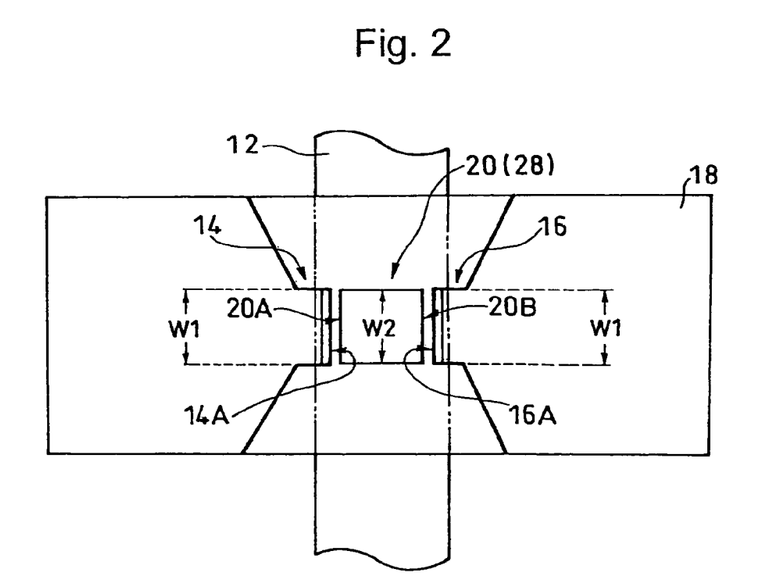
FIG. 2 is a sectional view taken along the line II-II in FIG. 1.

The magnetic storage device 10 of the first exemplary embodiment includes a plurality of storage areas. As shown in FIGS. 1 and 2, each storage area includes: a wiring 12 that provides an external magnetic field by a writing current; an approximately annular magnetic yoke 18 having a pair of open ends 14 and 16 opposed to each other with a gap interposed therebetween; and a magnetoresistive element 20 having a second magnetic layer (sensitive magnetic layer) 28 in which a magnetizing direction is changed by the external magnetic field.

The magnetic yoke 18 is arranged to surround an outer circumference of the wiring 12 at a portion in an extending direction of the wiring 12. The wiring 12 is used for writing of magnetizing information to the magnetoresistive element 20 and is arranged to pass near an axial center O1 of the magnetic yoke 18 in the first exemplary embodiment.

The magnetic yoke 18 is formed of Permalloy (NiFe) in the first exemplary embodiment as one unit that is magnetically and mechanically continuous. The structure and material of the magnetic yoke 18 are not limited thereto. For example, ferrocobalt (CoFe) can be used as the material of the magnetic yoke 18.

Figure 3:
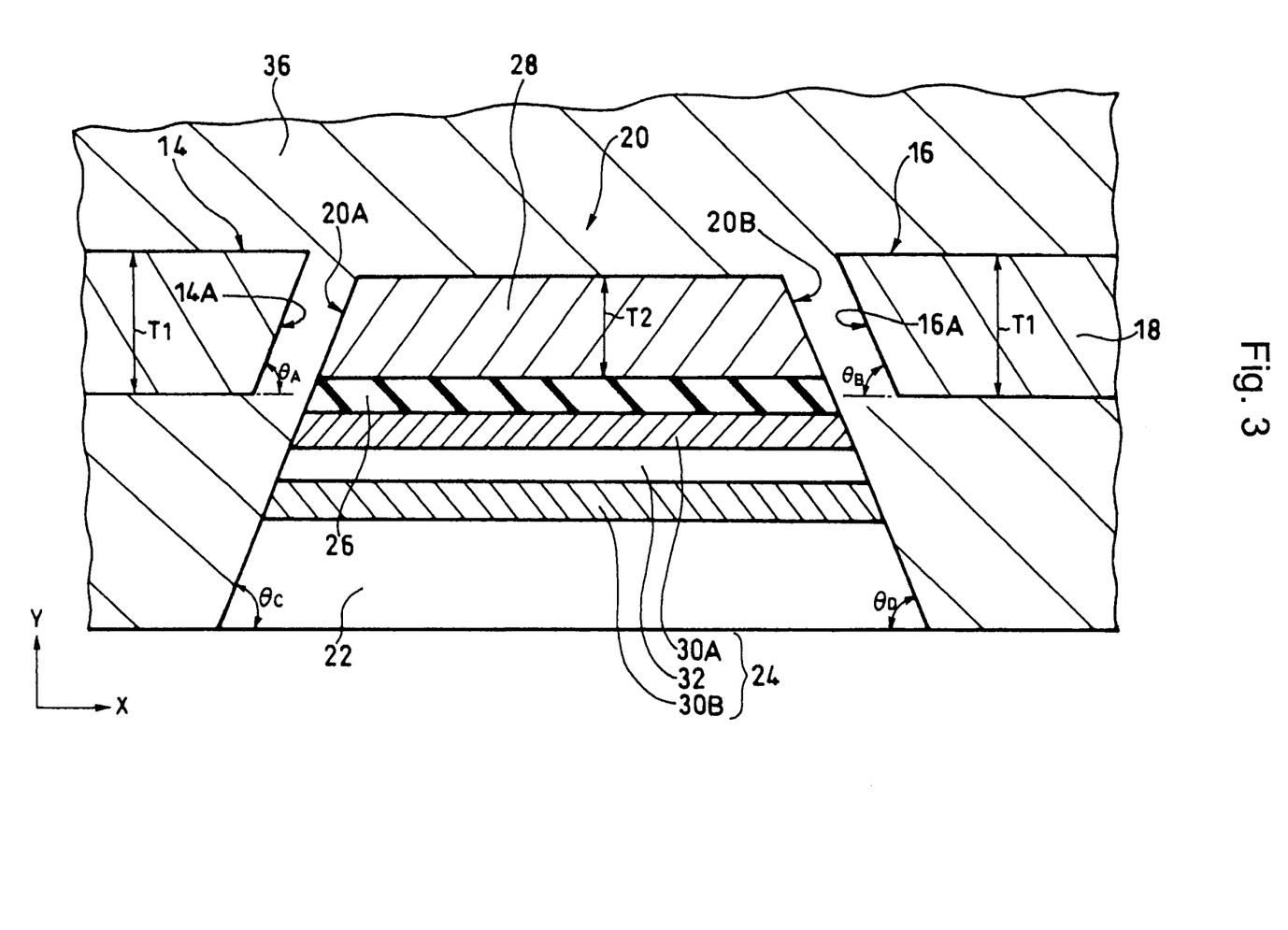
FIG. 3 is a partial enlarged view showing a portion around a magnetoresistive element in the magnetic storage device according to the first exemplary embodiment.

As shown in FIG. 3, the magnetoresistive element 20 includes an antiferromagnetic layer 22, a first magnetic layer 24, a non-magnetic layer 26, and a second magnetic layer 28 that are sequentially formed. The magnetoresistive element 20 can be easily manufactured by depositing the antiferromagnetic layer 22, the first magnetic layer 24, the non-magnetic layer 26, and the second magnetic layer 28 on a substrate (not shown) in that order or a reversed order by sputtering or the like.

The antiferromagnetic layer 22 is formed of a disordered alloy IrMn having a thickness of 90 nm in the first exemplary embodiment. Alternatively, a disordered alloy RuRhMn or an ordered alloy PtMn may be used for the antiferromagnetic layer 22, for example.

The first magnetic layer 24 is a so-called fixed layer (pinned layer) in which an orientation of magnetization is fixed. The first magnetic layer 24 is formed to be in contact with the antiferromagnetic layer 22. Thus, an exchange-coupling magnetic field is generated at an interface between the antiferromagnetic layer 22 and the first magnetic layer 24, thereby the orientation of magnetization in the first magnetic layer 24 is fixed.

The first magnetic layer 24 has a three-layer structure including a magnetic layer 30A, a non-magnetic conductive layer 32, and a magnetic layer 30B that are sequentially formed, in order to enhance a fixing force of the antiferromagnetic layer 22 for fixing the magnetizing direction in the first magnetic layer 24. In the first exemplary embodiment, the magnetic layer 30A is formed of a ferrocobalt alloy (CoFe) and has a thickness of 16 nm, the non-magnetic conductive layer 32 is formed of ruthenium (Ru) and has a thickness of 8.5 nm, and the magnetic layer 30B is formed of a ferrocobalt alloy (CoFe) and has a thickness of 12 nm. Alternatively, cobalt (Co), cobalt-platinum alloys (CoPt), and nickel-iron-cobalt alloys (NiFeCo) can be used for the magnetic layers 30A and 30B, for example.

The non-magnetic layer 26 is formed on the first magnetic layer 24. In the first exemplary embodiment, the non-magnetic layer 26 is formed of aluminum oxide ($Al_2O_3$) having a thickness of 9 nm.

The second magnetic layer 28 is a so-called sensitive magnetic layer (free layer) in which an orientation of magnetization can be changed. In the first exemplary embodiment, the second magnetic layer 28 is formed by forming a layer of a ferronickel alloy (NiFe) having a thickness of 30 nm on a layer of a ferrocobalt (CoFe) alloy having a thickness of 15 nm. The open ends 14 and 16 of the magnetic yoke 18 are arranged at approximately the same level as the second magnetic layer 28.

The open ends 14 and 16 of the magnetic yoke 18 are arranged at approximately the same level as the second magnetic layer 28.

Figure 4:
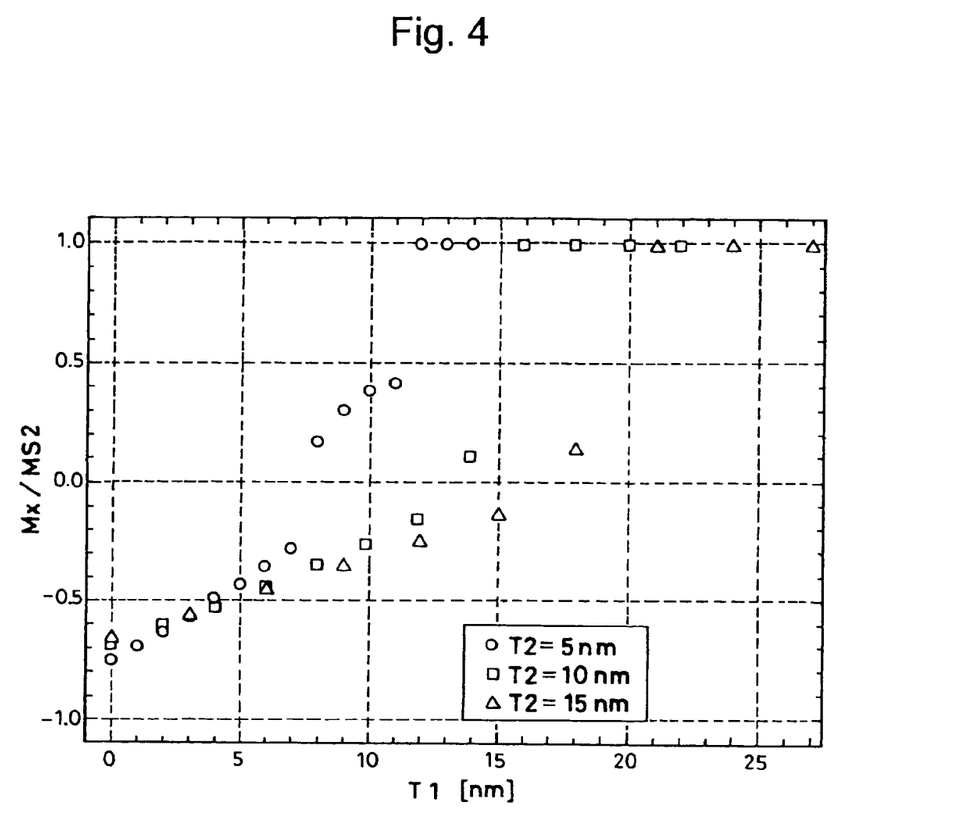
FIG. 4 is a graph showing a relationship between a maximum thickness of a portion around the magnetoresistive element in a diameter direction of a magnetic yoke and a ratio of magnetization reversal in a second magnetic layer of the magnetoresistive element in the magnetic storage device of the first exemplary embodiment.

FIG. 4 shows a result of measurement in which a maximum thickness T1 of each open end 14 or 16 of the magnetic yoke 18 and a ratio of magnetization reversal (Mx/MS2) in the second magnetic layer 28 of the magnetoresistive element 20 were measured when a maximum thickness T2 of the second magnetic layer 28 in a diameter direction Y of the magnetic yoke 18 was 5 nm, 10 nm, and 15 nm. The ratio of magnetization reversal (Mx/MS2) represents a ratio of magnetized components Mx in a direction of an axis of easy magnetization in the second magnetic layer 28 to saturated magnetization MS2 in the second magnetic layer 28.

It is found from the measurement result that for each thickness T2 of the second magnetic layer 28, the ratio of magnetization reversal (Mx/MS2) becomes rapidly larger with the increase of the maximum thickness T1 of each open end 14 or 16.

Thus, it is necessary that the maximum thickness T1 of each open end 14 or 16 of the magnetic yoke 18 and the maximum thickness T2 of the second magnetic layer 28 in the diameter direction Y of the magnetic yoke 18 satisfies a relationship of T1>T2.

However, when the maximum thickness T1 of each open end 14 or 16 is thicker than necessary, it is more difficult to saturate magnetization in the magnetic yoke 18. Thus, it is preferable that the maximum thickness T1 of each open end 14 or 16 be about 20 times or less the maximum thickness T2 of the second magnetic layer 28 of the magnetoresistive element 20 ($T1 \leq T2 \times 20$).

Moreover, a magnetic flux generated in the gap of the magnetic yoke 18 becomes larger in proportion to saturated magnetization MS1 in the magnetic yoke 18 and the thickness T1 of each of the open ends 14 and 16 of the magnetic yoke 18 in the diameter direction of the magnetic yoke 18. In addition, a demagnetization field in the second magnetic layer 28 of the magnetoresistive element 20 becomes larger in proportion to the thickness T2 of the second magnetic layer 28 and the saturated magnetization MS2 in the second magnetic layer 28.

Thus, the magnetization reversal in the second magnetic layer 28 can be made controllable by making a product of the maximum thickness T1 of each of the open ends 14 and 16 of the magnetic yoke 18 and the saturated magnetization MS1 in the magnetic yoke 18 equal to or larger than a product of the maximum thickness T2 of the second magnetic layer 28 of the magnetoresistive element 20 and the saturated magnetization MS2 in the second magnetic layer 28 ($T1 \times MS1 \geq T2 \times MS2$).

Axes of easy magnetization of the first and second magnetic layers 24 and 28 are set in such a manner that a stable magnetizing state in each of those layers is parallel or antiparallel to the axis of easy magnetization, and are set to be approximately coincident with an orientation of magnetic field lines inside the magnetic yoke 18 near a pair of open ends 14 and 16 of the magnetic yoke 18. Due to this structure, the orientation of the magnetic field lines inside the magnetic yoke 18 is parallel or antiparallel to the magnetizing direction in the second magnetic layer 28. Thus, the amount of the generated magnetic field that is required for magnetization reversal in the second magnetic layer 28 can be made minimum. It is preferable that the axes of easy magnetization of the first magnetic layer 24 and the second magnetic layer 28 be parallel to each other in order to make the magnetizing directions stable in a state where the magnetizing directions are parallel or antiparallel to each other.

Returning to FIG. 2, the magnetoresistive element 20 is arranged in such a manner that a pair of side faces 20A and 20B thereof (i.e., faces close to the magnetic yoke 18) are at least partially opposed to end faces 14A and 16A of a pair of open ends 14 and 16 of the magnetic yoke 18, respectively. Moreover, it is necessary that a width W1 of each open end 14 or 16 of the magnetic yoke 18 in an axial direction Z of the magnetic yoke 18 is equal to or larger than a width W2 of the second magnetic layer 28 of the magnetoresistive element 20 in the axial direction Z of the magnetic yoke 18 (W1≧W2) in order to prevent distribution of the magnetic flux associated with the magnetoresistive element 20 from becoming uneven. It is preferable that the width W1 of each open end 14 or 16 of the magnetic yoke 18 be three times or less a length L1 of the gap of the magnetic yoke 18 in a circumferential direction X of the magnetic yoke 18 (W1≦L1×3). This is because a magnetic field H measured around a center between the open ends 14 and 16 is approximately saturated when the width W1 of each open end 14 or 16 is larger than three times the length L1 of the gap of the magnetic yoke 18, as shown in FIGS. 5 to 8.

Figure 5:
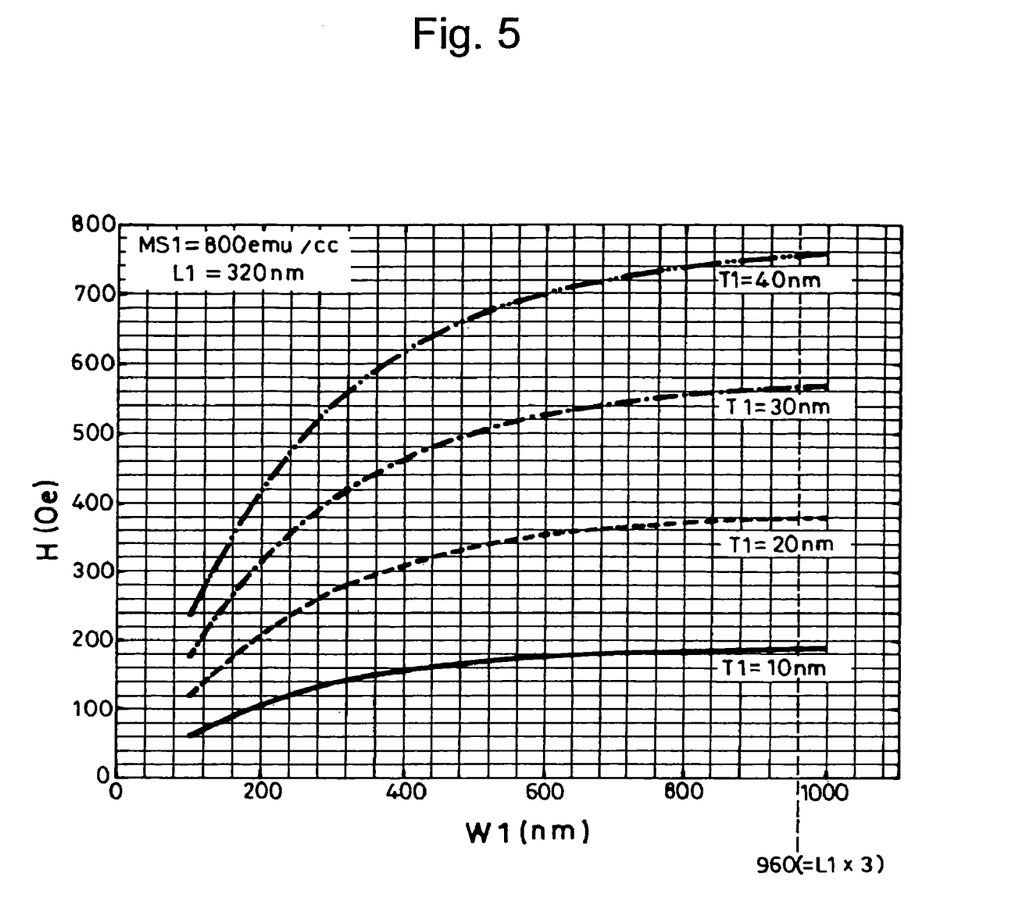
FIG. 5 is a graph showing a relationship between a width W1 of each of open ends of the magnetic yoke and magnetism H around a center between the open ends of the magnetic yoke (in the case where a length of a gap of the magnetic yoke is 320 nm) in the magnetic storage device of the first exemplary embodiment.
Figure 6:
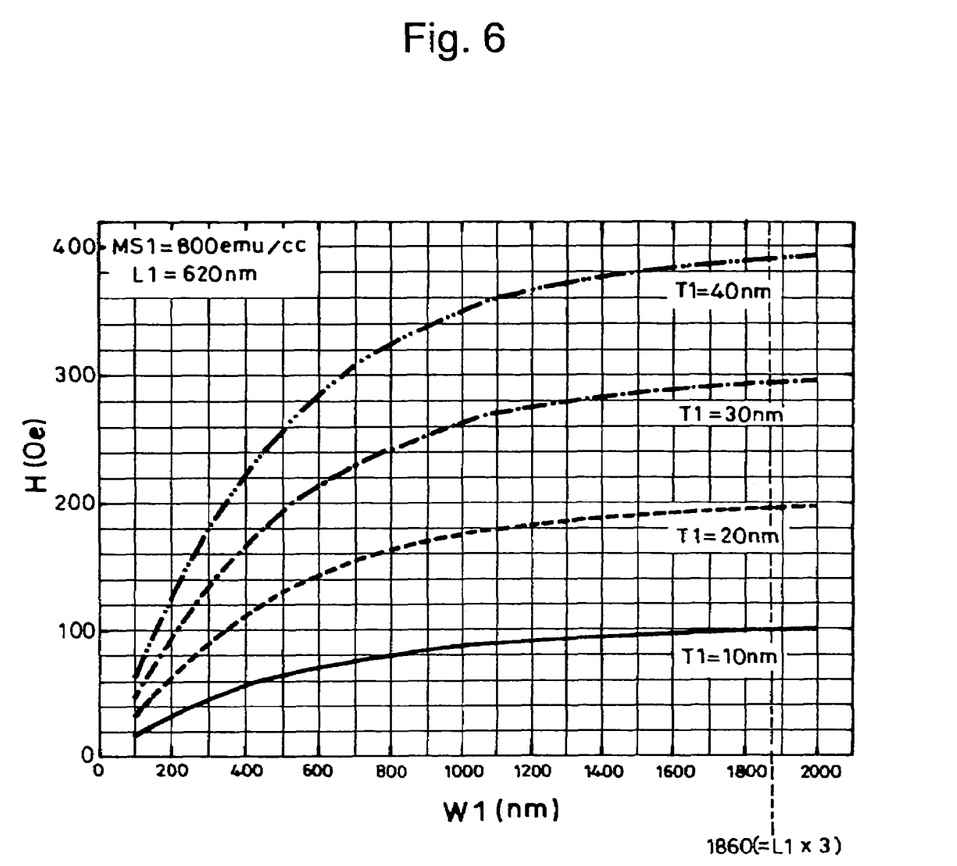
FIG. 6 is a graph showing the relationship between the width W1 of each of open ends of the magnetic yoke and the magnetism H around the center between the open ends of the magnetic yoke (in the case where the length of the gap of the magnetic yoke is 620 nm) in the magnetic storage device of the first exemplary embodiment.
Figure 7:
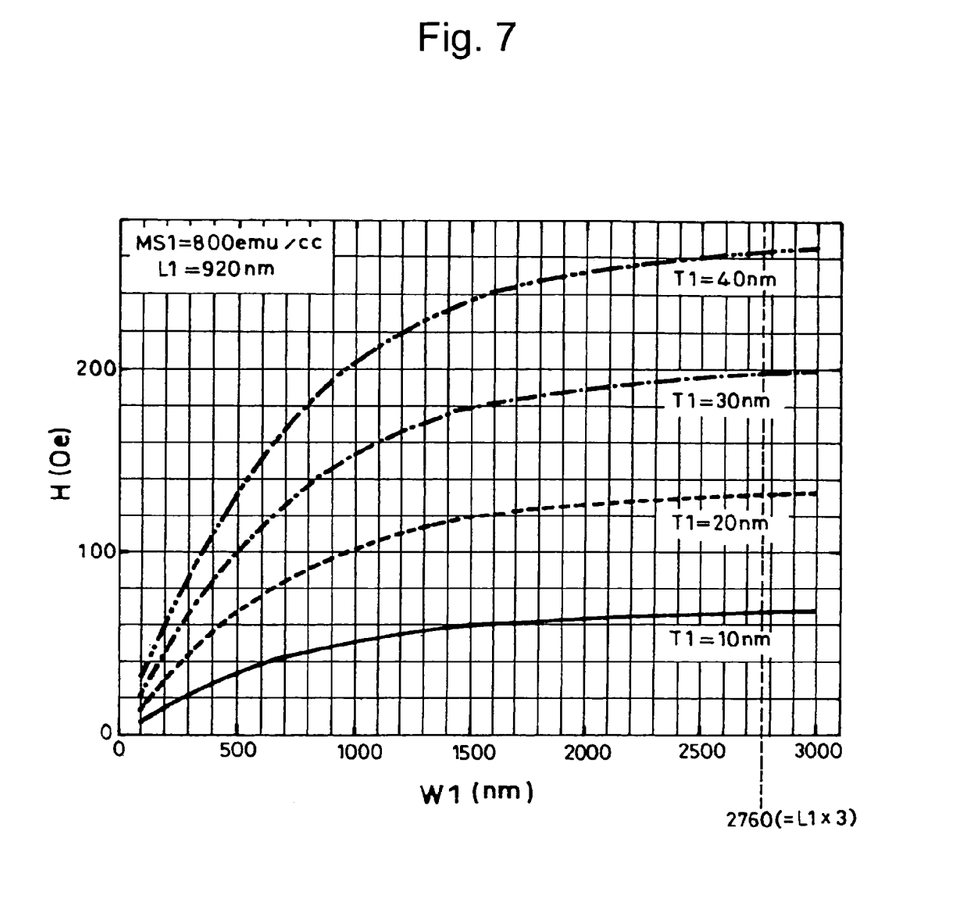
FIG. 7 is a graph showing the relationship between the width W1 of each of open ends of the magnetic yoke and the magnetism H around the center between the open ends of the magnetic yoke (in the case where the length of the gap of the magnetic yoke is 920 nm) in the magnetic storage device of the first exemplary embodiment.
Figure 8:
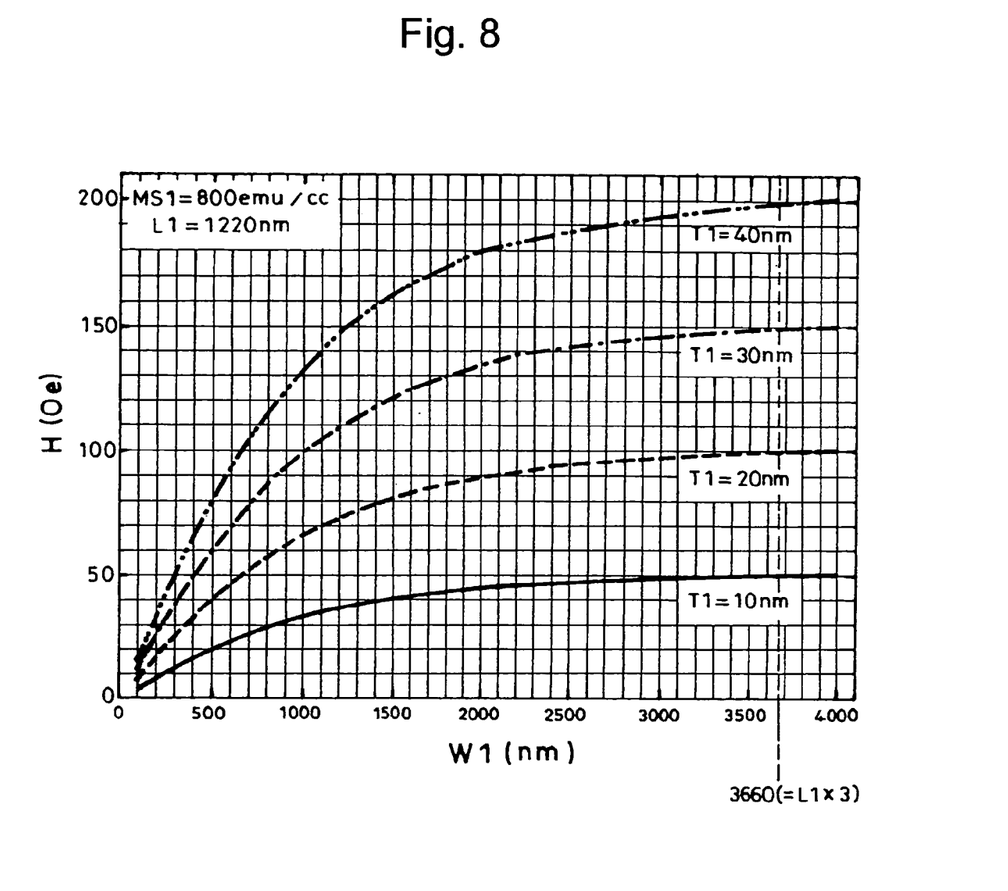
FIG. 8 is a graph showing the relationship between the width W1 of each of open ends of the magnetic yoke and the magnetism H around the center between the open ends of the magnetic yoke (in the case where the length of the gap of the magnetic yoke is 1220 nm) in the magnetic storage device of the first exemplary embodiment.
Figure 9:
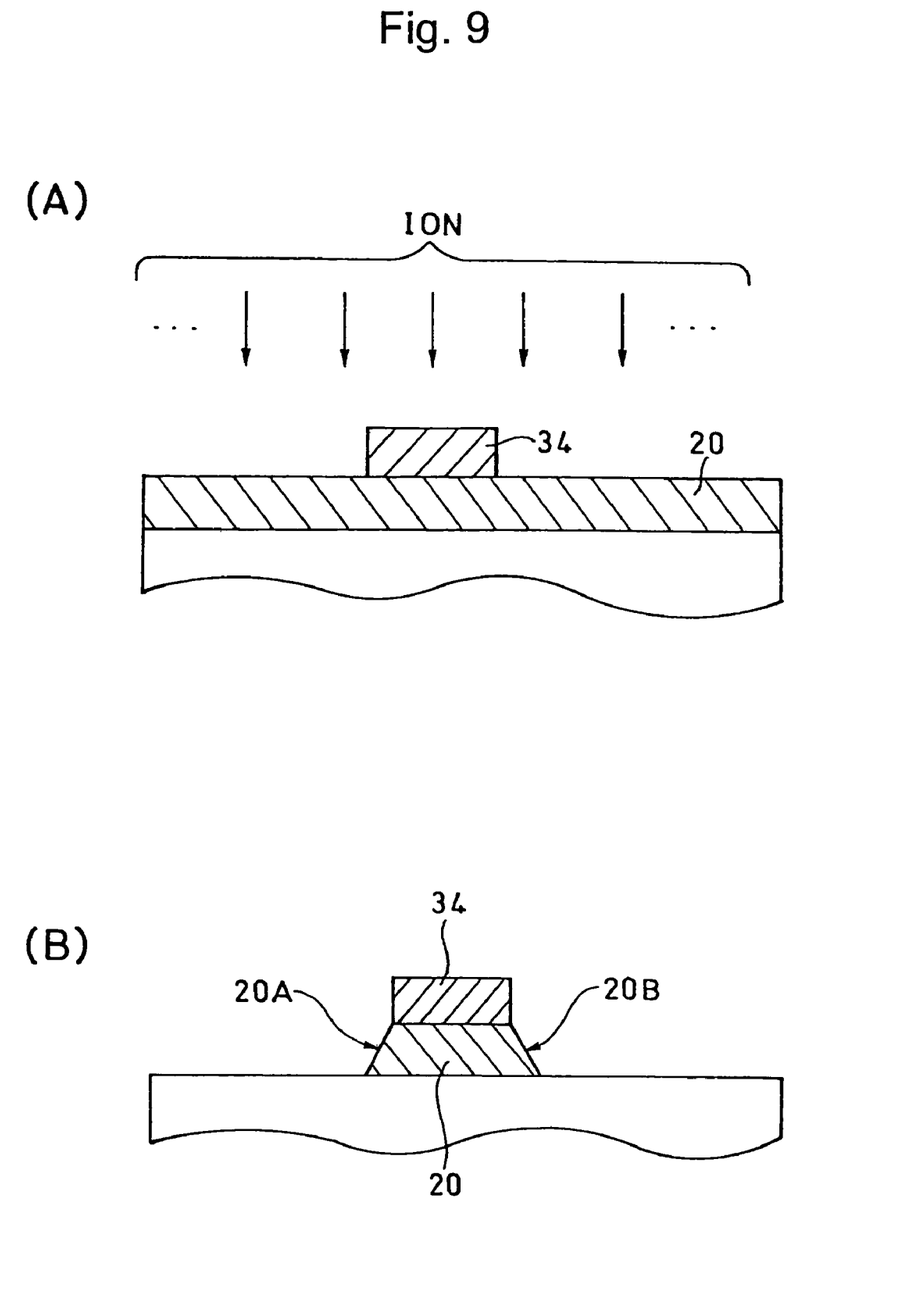
FIG. 9A is a schematic sectional side view showing a state in which ions are irradiated toward a surface of the magnetoresistive element of the magnetic storage device according to the first exemplary embodiment.
FIG. 9B is a schematic sectional view side showing the magnetoresistive element after ion milling.
Figure 10:
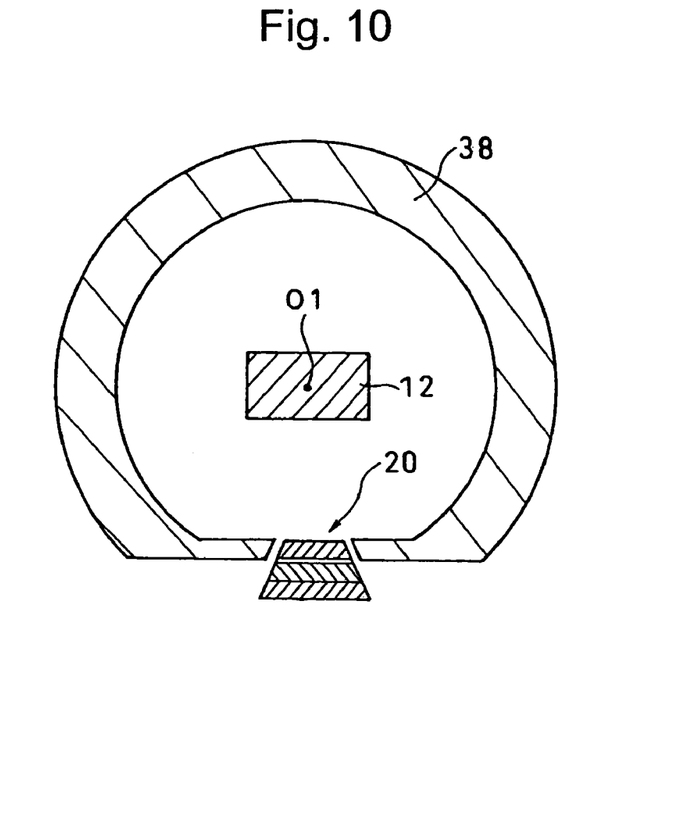
FIG. 10 is sectional side view of another example of a magnetic yoke of the magnetic storage device of the first exemplary embodiment.
Figure 11:
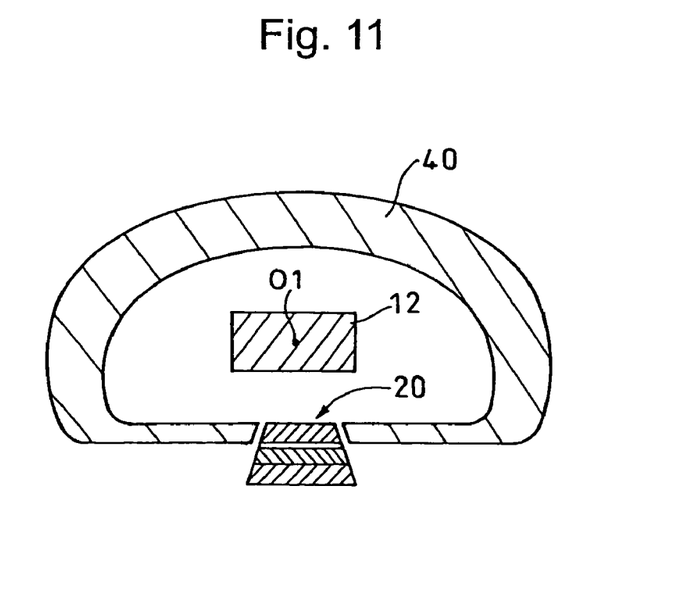
FIG. 11 is a sectional side view of still another example of the magnetic yoke of the magnetic storage device of the first exemplary embodiment.
Figure 12:
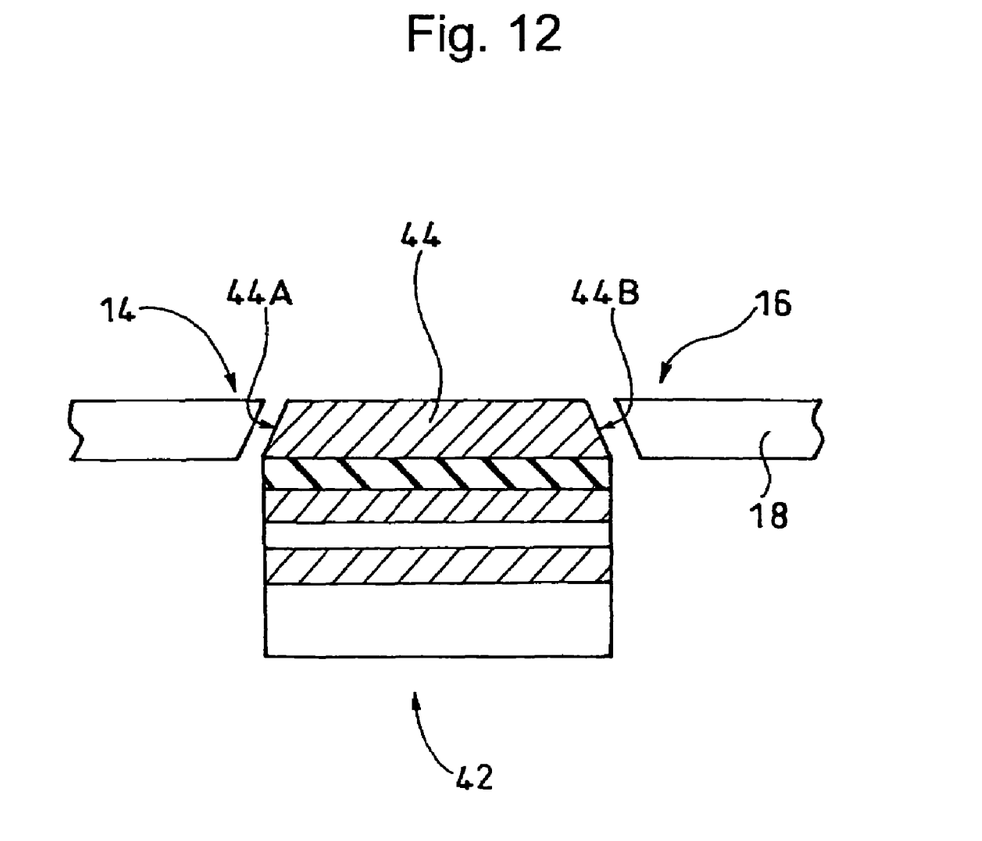
FIG. 12 is a sectional side view showing a part of a magnetic storage device according to another embodiment of the present invention.

Moreover, the length L1 of the gap of the magnetic yoke 18 is set to be equal to or larger than a length L2 of the second magnetic layer 28 of the magnetoresistive element 20 in the circumferential direction X of the magnetic yoke 18 and be equal to or smaller than 1 μm. Although the magnetic yoke 18 may be usually conductive, it has any form as long as the magnetoresistive element 20 can arranged within the gap. The magnetic yoke 18 may be in contact with the second magnetic layer 28 of the magnetoresistive element 20. The main reasons for limiting the length L1 of the gap of the magnetic yoke 18 to 1 μm or less are now described; (1) In the case where the length L1 of the gap of the magnetic yoke 18 is set to be larger than 1 μm, as shown in FIG. 8 (L1=1220 nm), the measured magnetic field H is reduced as compared with a case where the length L1 of the gap is set to 1 μm or less, as shown in FIGS. 5 to 7 (L1=320 nm, 620 nm, and 920 nm); (2) The length L1 of the gap that is larger than 1 μm is not realistic when improvement of the density of the magnetic storage device 10 and the like is considered.

As shown in FIG. 3, the end faces 14A and 16A of the open ends 14 and 16 of the magnetic yoke 18 and the side faces 20A and 20B of the magnetoresistive element 20 are inclined at predetermined angles of θA, θB, θC, and θD, respectively, in such a manner that a distance between the end faces 14A and 16A and a distance between the side faces 20A and 20B become larger downwards. In the first exemplary embodiment, all of the inclination angles θA and θB of the end faces 14A and 16A of the open ends 14 and 16 of the magnetic yoke 18 and the inclination angles θC and θD of the side faces 20A and 20A of the magnetoresistive element 20 are set to approximately the same angle that is equal to or larger than 20 degrees and is smaller than 90 degrees.

The side faces 20A and 20B of the magnetoresistive element 20 can be processed to be inclined by ion milling, reactive ion etching (RIE), or the like. For example, in ion milling, discharge is generated by applying a voltage to argon gas under a predetermined pressure, thereby generating plasma. Then, a voltage of about 100 to 500 V is applied as an acceleration voltage to ions in the plasma so as to accelerate those ions in a predetermined direction. The thus accelerated ions ION are irradiated toward a surface of the magnetoresistive element 20 as shown in FIG. 4A to cause collision of the ions ION against the magnetoresistive element 20,. As a result, as shown in FIG. 4B, the magnetoresistive element 20 outside a region masked with a resist pattern 34 is removed by a sputtering phenomenon caused by the collision. Moreover, the side faces 20A and 20B of the magnetoresistive element 20 can be inclined at an angle of about 20 degrees to about 90 degrees by controlling an irradiation angle and an irradiation time of the ions ION.

In reactive ion etching, anisotropic etching can be performed with high precision due to sputtering using ions and chemical reaction of etching gas that is changed to plasma. This reactive ion etching can incline the side faces 20A and 20B of the magnetoresistive element 20 at an angle of about 20 degrees to about 80 degrees. When the inclination angle is made smaller, a cross-sectional area of a top of each open end 14 or 16 of the magnetic yoke 18 becomes smaller. Thus, saturation of magnetization occurs rapidly at the top of the magnetic yoke 18 and a magnetic flux can be more easily generated from the magnetic yoke 18. However, broadening of regions of the end faces 14A and 16A occurs in this case. Therefore, the smaller inclination angle is not realistic and is unfavorable in terms of obtaining a high-density device. For this reason, it is preferable to design the inclination angle to be the most appropriate angle in a region of from 20 to 90 degrees in accordance with needs.

After the magnetoresistive element 20 is shaped, an insulation layer 36 is formed from a non-conductive material such as aluminum oxide ($Al_2O_3$) to have an approximately uniform thickness on the magnetoresistive element 20. Then, the open ends 14 and 16 of the magnetic yoke 18 are formed.

An operation of the magnetic storage device 10 of the first exemplary embodiment is now described.

When a current flows through the wiring 12, a magnetic field is generated around the wiring 12. Magnetic field lines of that magnetic field pass inside the magnetic yoke 18 and are directed from the end faces 14A and 16A of the open ends 14 and 16 of the magnetic yoke 18 to the second magnetic layer 28 of the magnetoresistive element 20. As a result, the magnetizing direction in the second magnetic layer 28 is reversed with reversal of the magnetizing direction of the magnetic yoke 18. Thus, the second magnetic layer 28 can serve as a recording layer for storing magnetizing information therein.

As described above, the shape of the magnetic yoke 18 is optimized in the magnetic storage device 10 of the first embodiment in various ways. More specifically, (1) the maximum thickness T1 of each of the open ends 14 and 16 of the magnetic yoke 18 in the diameter direction Y of the magnetic yoke 18 is set to be larger than the maximum thickness T2 of the second magnetic layer (sensitive magnetic layer) 28 of the magnetoresistive element 20 in the diameter direction Y of the magnetic yoke 18, (2) the product of the maximum thickness T1 of each open end 14 or 16 of the magnetic yoke 18 and the saturated magnetization MS1 in the magnetic yoke 18 is set to be larger than the product of the maximum thickness T2 of the second magnetic layer 28 of the magnetoresistive element 20 and the saturated magnetization MS2 of the second magnetic layer 28, (3) the width W1 of each open end 14 or 16 of the magnetic yoke 18 in the axial direction Z of the magnetic yoke 18 is set to be equal to or larger than the width W2 of the second magnetic layer 28 of the magnetoresistive element 20 in the axial direction of the magnetic yoke 18 and be three times or less the length L1 of the gap of the magnetic yoke 18 in the circumferential direction X of the magnetic yoke 18, and (4) the length L1 of the gap of the magnetic yoke 18 is set to be equal to or larger than the length L2 of the second magnetic layer 28 of the magnetoresistive element 20 in the circumferential direction X of the magnetic yoke 18 and be equal to or smaller than 1 μm. Thus, according to the magnetic storage device 10 of the first exemplary embodiment, the shape of the magnetic yoke can be materialized. Moreover, the magnetic field generated from the magnetic yoke can be increased by optimization of the shape of the magnetic yoke, thereby reducing writing current.

An example is described in the first exemplary embodiment, in which all of the above (1) to (4) are carried out as optimization of the shape of the magnetic yoke 18 in order to enhance the effects of the present invention. However, the effects of the present invention can be achieved by carrying out at least one of the above (1) to (4).

According to the magnetic storage device 10 of the first exemplary embodiment, the side faces 20A and 20B of the magnetoresistive element 20 are at least partially opposed to the end faces 14A and 16A of the open ends of the magnetic yoke 18, respectively, and the side faces 20A and 20B of the magnetoresistive element 20 and the end faces 14A and 16A of the open ends 14 and 16 of the magnetic yoke 18 have predetermined inclination angles θA, θB, θC, and θD, respectively. Thus, surface areas of the end faces 14A and 16A of the open ends 14 and 16 of the magnetic yoke 18 and the side faces 20A and 20B of the magnetoresistive element 20 can be made larger. Thus, the magnetic flux of the magnetic field directed from the magnetic yoke 18 to the magnetoresistive element 20 can be increased and the writing current can be further reduced. Moreover, the cross-sectional area of the top of each open end 14 or 16 of the magnetic yoke 18 can be made smaller. Thus, saturation of magnetization at the top of the magnetic yoke 18 can occur rapidly and therefore a magnetic flux can be more easily generated from the magnetic yoke 18. This can increase the magnetic flux of the magnetic field directed to the magnetoresistive element 20.

Since all of the side faces 20A and 20B of the magnetoresistive element 20 and the end faces 14A and 16A of the open ends 14 and 16 of the magnetic yoke 18 are inclined at approximately the same angle, it is easy to process them. Furthermore, it is possible to uniformly direct the magnetic flux of the magnetic field generated from the magnetic yoke 18 to the magnetoresistive element 20. Therefore, the writing current can be further reduced. In addition, the magnitude of the magnetic flux directed to the magnetoresistive element 20 and a timing at which the magnetic flux is applied can be made approximately the same for a plurality of storage areas (cells). This can suppress variation in writing characteristics.

Since the magnetic yoke 18 is formed as one continuous unit, magnetic resistance of the magnetic yoke 18 can be reduced. This equalizes the magnetic field lines passing inside the magnetic yoke 18, thus suppressing turbulence caused by the magnetic resistance.

Since the wiring 12 is arranged to pass near the axial center O1 of the magnetic yoke 18, the magnetic flux of the magnetic field generated from the wiring 12 can be efficiently directed to the inside of the magnetic yoke 18. Thus, even when the magnitude of the writing current is small, writing can be performed efficiently and stably.

Moreover, the side faces 20A and 20B of the magnetoresistive element 20 are at least partially opposed to the end faces 14A and 16A of the open ends 14 and 16 of the magnetic yoke 18, respectively, and the orientation of the magnetic field lines inside the magnetic yoke 18 near the open ends 14 and 16 of the magnetic yoke 18 is approximately coincident with the orientation of the axis of easy magnetization of the magnetoresistive element 20. Thus, the magnetization in the magnetoresistive element 20 can be efficiently reversed while the magnetic storage device 10 can have a compact and simple structure, and the writing current can be reduced as compared with that in a conventional magnetic storage device. Moreover, a wrong operation caused by tilt of magnetization in the sensitive magnetic layer because of an effect of residual magnetization in the magnetic yoke 18 does not occur. Thus, the magnetic storage device 10 can perform writing more stably.

Since the insulation layer 36 that is formed of a non-conductive material and has an approximately uniform thickness is provided between a pair of side faces 20A and 20B of the magnetoresistive element 20 and the end faces 14A and 16A of the pair of open ends 14 and 16 of the magnetic yoke 18, a distance between the magnetoresistive element 20 and the magnetic yoke 18 can be kept constant. Thus, it is possible to make the intensity of the magnetic flux generated from the magnetic yoke 18 uniform and allow that magnetic flux to effectively affect the magnetoresistive element 20.

The magnetoresistive element 20 includes at least the antiferromagnetic layer 22, the first magnetic layer 24, the non-magnetic layer 26, and the second magnetic layer 28 that are sequentially formed. Thus, the magnetoresistive element 20 can achieve a magnetoresistive effect in a low magnetic field. It is also possible to easily determine the magnetizing direction in the sensitive magnetic layer.

Moreover, the first magnetic layer 24 has a three-layer structure including the magnetic layer 30A, the non-magnetic conductive layer 32, and the magnetic layer 30B. Thus, the magnetizing direction in the first magnetic layer 24 serving as the fixed layer is not made unstable by a magnetic field generated from a gap in the magnetic yoke 18. Therefore, it is possible to make the orientation of magnetization in the fixed layer harder to reverse.

Note that the magnetic storage device of the present invention is not limited to the structure, shape, and the like of the magnetic storage device 10 according to the above first exemplary embodiment.

Alternatively, a magnetic yoke 38 in which its cross-sectional shape in a diameter direction is approximately round, as shown in FIG. 5, or a magnetic yoke 40 in which its cross-sectional shape in the diameter direction is approximately oval, as shown in FIG. 6, may be used in place of the magnetic yoke 18 in the first embodiment, for example. In this case, the magnetic field lines passing inside the magnetic yoke 38 (40) can be made more uniform and therefore the magnetic field caused by the writing current can be stabilized.

Although a pair of side faces 20A and 20B of the magnetoresistive element 20 are entirely inclined in the magnetic storage device 10 of the first exemplary embodiment, the magnetic storage device 10 of present invention may be configured such that only faces 44A and 44B of a sensitive magnetic layer 44 that are close to the magnetic yoke 18 (i.e., at least a part of a pair of side faces of the magnetoresistive element 42) may be inclined as in a magnetoresistive element 42 shown in FIG. 7, for example.

Although all of the inclination angles θA and θB of the end faces 14A and 16A of the open ends 14 and 16 of the magnetic yoke 18 and the inclination angles θC and θD of the side faces 20A and 20B of the magnetoresistive element 20 are set to approximately the same angle, the magnetic storage device 10 of the present invention may be configured such that the inclination angles θA, θB, θC, and θD may be set to different angles.

What is claimed is:

1. A magnetic storage device comprising a plurality of storage areas each of which comprises:

a magnetoresistive element having a sensitive magnetic layer in which a magnetizing direction is changed by an external magnetic field;

a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a maximum thickness of each of the open ends of the magnetic yoke in a diameter direction of the magnetic yoke is set to be larger than a maximum thickness of the sensitive magnetic layer of the magnetoresistive element in the diameter direction of the magnetic yoke.

2. The magnetic storage device according to claim 1, wherein the magnetoresistive element is arranged in such a manner that a pair of side faces thereof are at least partially opposed to end faces of the open ends of the magnetic yoke, respectively, and at least a part of the pair of side faces of the magnetoresistive element and the end faces of the open ends of the magnetic yoke have predetermined angles, respectively.

3. A magnetic storage device comprising a plurality of storage areas each of which comprises:

a magnetoresistive element having a sensitive magnetic layer in which a magnetizing direction is changed by an external magnetic field;

a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a product of a maximum thickness of each of the open ends of the magnetic yoke in a diameter direction of the magnetic yoke and saturated magnetization in the magnetic yoke is set to be larger than a product of a maximum thickness of the sensitive magnetic layer of the magnetoresistive element in the diameter direction of the magnetic yoke and saturated magnetization in the sensitive magnetic layer.

4. The magnetic storage device according to claim 3, wherein the magnetoresistive element is arranged in such a manner that a pair of side faces thereof are at least partially opposed to end faces of the open ends of the magnetic yoke, respectively, and at least a part of the pair of side faces of the magnetoresistive element and the end faces of the open ends of the magnetic yoke have predetermined angles, respectively.

5. A magnetic storage device comprising a plurality of storage areas each of which comprises:

a magnetoresistive element having a sensitive magnetic layer in which a magnetizing direction is changed by an external magnetic field;

a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a width of each of the open ends of the magnetic yoke in an axial direction of the magnetic yoke is set to be equal to or larger than a width of the sensitive magnetic layer of the magnetoresistive element in the axial direction of the magnetic yoke and is set to be three times or less a length of the gap of the magnetic yoke in a circumferential direction of the magnetic yoke.

6. The magnetic storage device according to claim 5, wherein the magnetoresistive element is arranged in such a manner that a pair of side faces thereof are at least partially opposed to end faces of the open ends of the magnetic yoke, respectively, and at least a part of the pair of side faces of the magnetoresistive element and the end faces of the open ends of the magnetic yoke have predetermined angles, respectively.

7. A magnetic storage device comprising a plurality of storage areas each of which comprises:

a magnetoresistive element having a sensitive magnetic layer in which a magnetizing direction is changed by an external magnetic field;

a wiring for providing the external magnetic field to the sensitive magnetic layer by writing current; and an approximately annular magnetic yoke having at least a pair of open ends opposed to each other with a gap interposed therebetween, the magnetic yoke being arranged to surround an outer circumference of the wiring at a portion in an extending direction of the wiring, wherein a length of the gap of the magnetic yoke in a circumferential direction of the magnetic yoke is set to be equal to or larger than a length of the sensitive magnetic layer of the magnetoresistive element in the circumferential direction of the magnetic yoke and is set to be equal to or smaller than 1 µm.

8. The magnetic storage device according to claim 7, wherein the magnetoresistive element is arranged in such a manner that a pair of side faces thereof are at least partially opposed to end faces of the open ends of the magnetic yoke, respectively, and at least a part of the pair of side faces of the magnetoresistive element and the end faces of the open ends of the magnetic yoke have predetermined angles, respectively.

* * * * *